United States Patent
Stefanov et al.

(10) Patent No.: US 10,211,822 B2
(45) Date of Patent: Feb. 19, 2019

(54) CIRCUIT ARRANGEMENT FOR FAST TURN-OFF OF BI-DIRECTIONAL SWITCHING DEVICE

(71) Applicant: NXP USA, Inc., Austin, TX (US)

(72) Inventors: Evgueniy Nikolov Stefanov, Vieille-Toulouse (FR); Laurent Guillot, Seysses (FR)

(73) Assignee: NXP USA, Inc., Austin, TX (US)

( * ) Notice: Subject to any disclaimer, the term of this patent is extended or adjusted under 35 U.S.C. 154(b) by 9 days.

(21) Appl. No.: 15/600,961

(22) Filed: May 22, 2017

(65) Prior Publication Data

US 2017/0338809 A1 Nov. 23, 2017

(30) Foreign Application Priority Data

May 23, 2016 (EP) .................. 16305587

(51) Int. Cl.
| | |
|---|---|
| G05F 1/10 | (2006.01) |
| H03K 17/041 | (2006.01) |
| H01L 27/07 | (2006.01) |
| H01L 29/40 | (2006.01) |
| H01L 29/78 | (2006.01) |

(Continued)

(52) U.S. Cl.
CPC ... *H03K 17/04106* (2013.01); *H01L 27/0727* (2013.01); *H01L 29/086* (2013.01); *H01L 29/0865* (2013.01); *H01L 29/402* (2013.01); *H01L 29/407* (2013.01); *H01L 29/7802* (2013.01); *H01L 29/7813* (2013.01); *H03K 5/08* (2013.01); *H03K 17/102* (2013.01); *H03K 2217/0009* (2013.01); *H03K 2217/0018* (2013.01); *H03K 2217/0054* (2013.01)

(58) Field of Classification Search
None
See application file for complete search history.

(56) References Cited

U.S. PATENT DOCUMENTS

| | | | |
|---|---|---|---|
| 7,282,406 B2 | 10/2007 | Grivna et al. | |
| 7,297,603 B2 | 11/2007 | Robb et al. | |

(Continued)

FOREIGN PATENT DOCUMENTS

| | | |
|---|---|---|
| EP | 1 887 698 A2 | 2/2008 |
| EP | 2 533 246 A1 | 12/2012 |

(Continued)

*Primary Examiner* — Long Nguyen

(57) ABSTRACT

Embodiments of a transistor control device for controlling a bi-directional power transistor are disclosed. In an embodiment, a transistor control device for controlling a bi-directional power transistor includes a resistor connectable to a body terminal of the bi-directional power transistor and a transistor body switch circuit connectable to the resistor, to a drain terminal of the bi-directional power transistor, and to a source terminal of the bi-directional power transistor. The transistor body switch circuit includes switch devices and alternating current (AC) capacitive voltage dividers connected to control terminals of the switch devices. The AC capacitive voltage dividers are configured to control the switch devices to switch a voltage of the body terminal of the bi-directional power transistor as a function of a voltage between the drain terminal of the bi-directional power transistor and the source terminal of the bi-directional power transistor.

10 Claims, 5 Drawing Sheets

(51) Int. Cl.
    *H03K 5/08*     (2006.01)
    *H03K 17/10*     (2006.01)
    *H01L 29/08*     (2006.01)

(56) References Cited

U.S. PATENT DOCUMENTS

| | | | |
|---|---|---|---|
| 7,537,970 | B2 | 5/2009 | Robb et al. |
| 7,910,409 | B2 | 3/2011 | Robb et al. |
| 8,101,969 | B2 | 1/2012 | Robb et al. |
| 8,530,284 | B2 * | 9/2013 | Robb .............. H01L 21/823487 |
| | | | 257/E29.215 |
| 9,443,845 | B1 * | 9/2016 | Stafanov ............. H01L 27/0727 |
| 9,472,662 | B2 | 10/2016 | Stefanov et al. |
| 9,559,198 | B2 | 1/2017 | Stefanov et al. |
| 2007/0205431 | A1 | 9/2007 | Robb et al. |
| 2012/0083075 | A1 * | 4/2012 | Robb .............. H01L 21/823487 |
| | | | 438/134 |
| 2016/0247799 | A1 * | 8/2016 | Stafanov ............. H01L 27/0727 |

FOREIGN PATENT DOCUMENTS

| | | |
|---|---|---|
| EP | 2 779 455 A1 | 9/2014 |
| WO | 00/19540 A1 | 4/2000 |
| WO | 2007/008934 A1 | 1/2007 |

* cited by examiner

CIRCUIT ARRANGEMENT FOR FAST TURN-OFF OF BI-DIRECTIONAL SWITCHING DEVICE

CROSS-REFERENCE TO RELATED APPLICATIONS

This application claims the priority under 35 U.S.C. § 119 of European Patent application No. 16305587.4, filed on May 23, 2016, the contents of which are incorporated by reference herein.

BACKGROUND

Bi-directional switches are used in a variety of electrical systems. Bi-directional switches can switch high currents through conduction electrodes while blocking high voltages applied to the conduction electrodes. For example, a typical bi-directional switch can supply high currents, which can range from several Amperes to several hundreds of Amperes depending on the specific switch and application, while blocking relatively high voltages, e.g., of at least 25 V without breaking down. However, transient current can be generated during a fast turn-off of a bi-directional switch. Transient current can cause a snapback bipolar effect, which results in current focalization in a relatively small active area of a bi-directional switch. Thus, there is a need for improving the reliability of a bi-directional switch during a fast turn-off.

SUMMARY

Embodiments of a transistor control device for controlling a bi-directional power transistor are disclosed. According to a first aspect of the present disclosure, there is provided a transistor control device for controlling a bi-directional power transistor. The transistor control device includes a resistor connectable to a body terminal of the bi-directional power transistor and a transistor body switch circuit connectable to the resistor, to a drain terminal of the bi-directional power transistor, and to a source terminal of the bi-directional power transistor. The transistor body switch circuit includes switch devices and alternating current (AC) capacitive voltage dividers connected to control terminals of the switch devices. The AC capacitive voltage dividers are configured to control the switch devices to switch a voltage of the body terminal of the bi-directional power transistor as a function of a voltage between the drain terminal of the bi-directional power transistor and the source terminal of the bi-directional power transistor.

In one or more embodiments, a resistance value of the resistor is the same as or more than a resistance value of an inherent body resistance of the bi-directional power transistor.

In one or more embodiments, the bi-directional power transistor includes a bi-directional trench transistor having two vertical trenches.

In one or more embodiments, at least one of the AC capacitive voltage dividers includes a diode and a second resistor. A cathode of the diode is connected to the second resistor. An anode of the diode is connected to the control terminal of a corresponding switch device.

In one or more embodiments, the switch devices includes a first field effect transistor (FET) and a second FET. The AC capacitive voltage dividers include a first AC capacitive voltage divider and a second AC capacitive voltage divider. The first AC capacitive voltage divider includes a first diode, a second resistor and a gate capacitance of the second FET. The second AC capacitive voltage divider includes a second diode, a third resistor, and a gate capacitance of the second FET.

In one or more embodiments, a cathode of the first diode is connected to the second resistor. An anode of the first diode is connected to a gate terminal of the second FET. A cathode of the second diode is connected to the third resistor. An anode of the second diode is connected to a gate terminal of the first FET.

In one or more embodiments, the second resistor is connectable to the source terminal of the bi-directional power transistor. The third resistor is connectable to the drain terminal of the bi-directional power transistor.

In one or more embodiments, the resistor is connected to a node between the first and second FETs.

In one or more embodiments, the transistor body switch circuit further includes a clamp circuit connected to the resistor, to the first FET, and to the second FET. The clamp circuit is configured to clamp a voltage difference between each of the gate terminals of the first and second FETs relative to the body terminal of the bi-directional power transistor to be below the breakdown voltage of the gate terminals of the first and second FETs.

In one or more embodiments, the clamp circuit includes a third diode, pull-down resistors, and Zener diodes.

Other aspects and advantages of embodiments of the present invention will become apparent from the following detailed description taken in conjunction with the accompanying drawings.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment of the present invention. Thus, the phrases "in one embodiment," "in an embodiment," and similar language throughout this specification may, but do not necessarily, all refer to the same embodiment.

Figure 1:
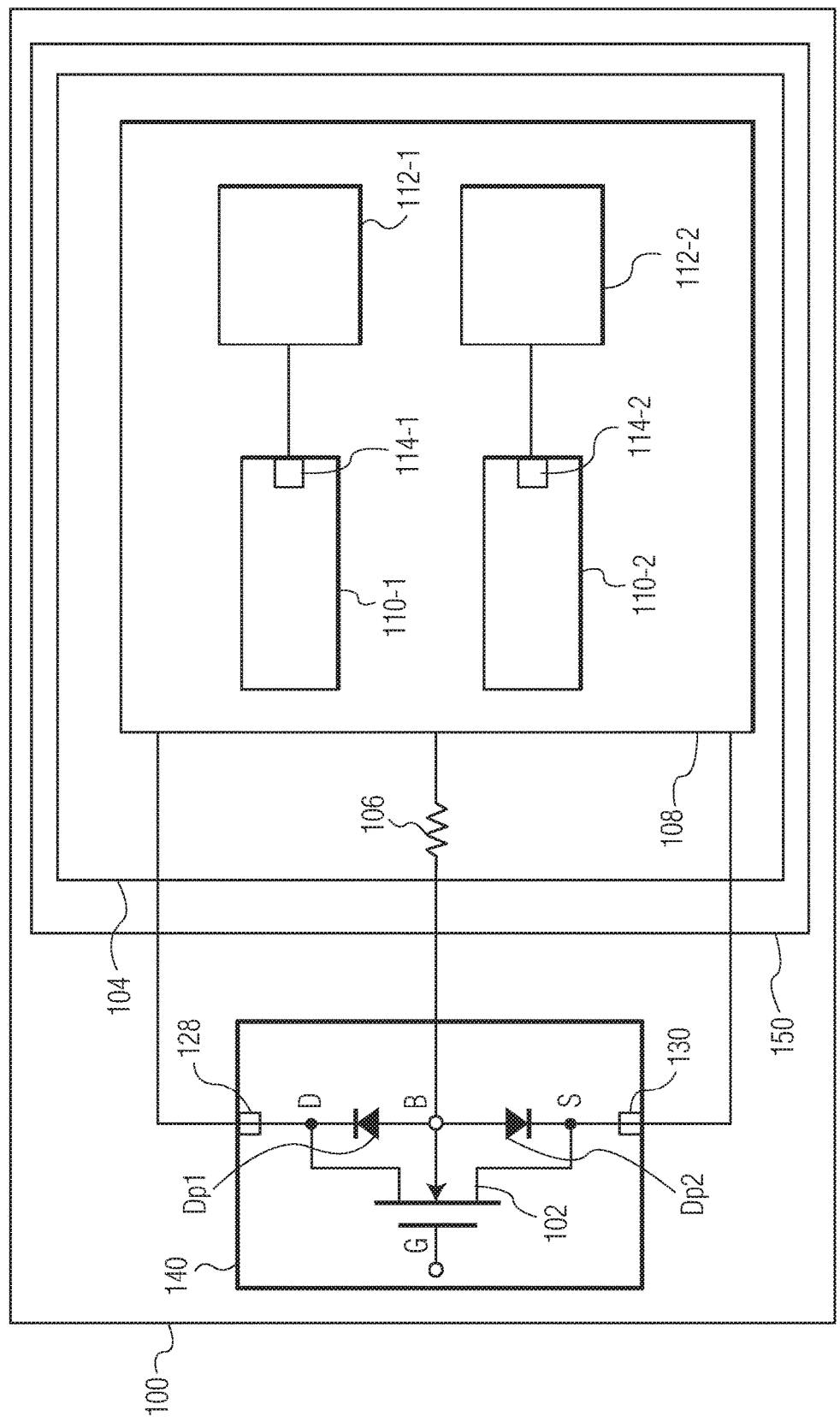
FIG. 1 depicts a bi-directional switching device in accordance with an embodiment of the invention.

FIG. 1 depicts a bi-directional switching device 100 in accordance with an embodiment of the invention. In the embodiment depicted in FIG. 1, the bi-directional switching device includes a bi-directional power transistor 102 and a transistor body control device 104. The bi-directional switching device may be an integrated circuit (IC) device, such as an IC module. The bi-directional switching device may be implemented with a switch system or a relay system. In some embodiments, the bi-directional switching device is implemented in an Ethernet switch. Although the illustrated bi-directional switching device is shown with certain components and described with certain functionality herein, other embodiments of the bi-directional switching device may include fewer or more components to implement the same, less, or more functionality. For example, although the bi-directional switching device is illustrated in FIG. 1 as including one bi-directional power transistor, in other embodiments, the bi-directional switching device may include multiple cells of bi-directional power transistors. Depending on the specific implementation, the bi-directional switching device may include tens, hundreds, thousands or more bi-directional power transistors that form a suitable arrangement (e.g. 2-dimensional matrix).

In the embodiment depicted in FIG. 1, the bi-directional power transistor 102 is located on a power die 140 and the transistor body control device 104 is located on a control die 150. Although the control die is shown in FIG. 1 as including one body control device, in other embodiments, other control circuitry may be included in the control die. For example, the control die may include additional control circuitry, which is activated in specific conditions such as overload, over temperature, short circuits, etc. to control the bi-directional power transistor to operate in a state that avoids permanent damage to the bi-directional power transistor.

In the bi-directional switching device 100 depicted in FIG. 1, the bi-directional power transistor 102 includes a gate terminal G, a drain terminal D, a body terminal B, and a source terminal S. Anodes of parasitic or inherent diodes Dp1, Dp2 of the bi-directional power transistor are connected to the body terminal B of the bi-directional power transistor. The cathode of the diode Dp1 is connected to the drain terminal D of the bi-directional power transistor and the cathode of the diode Dp2 is connected to the source terminal S of the bi-directional power transistor. The body terminal B, the drain terminal D, and the source terminal S of the bi-directional power transistor are connected to the transistor body control device 104. Each of the drain terminal D and the source terminal S of the bi-directional power transistor may be connected to an IC contact pin 128 or 130. One of the IC contact pins allows a corresponding terminal of the bi-directional power transistor to be connected to an external power or signal source while the other one of the IC contact pins allows a corresponding terminal of the bi-directional power transistor to be connected to a load device that is driven by the bi-directional power transistor.

Figure 2:
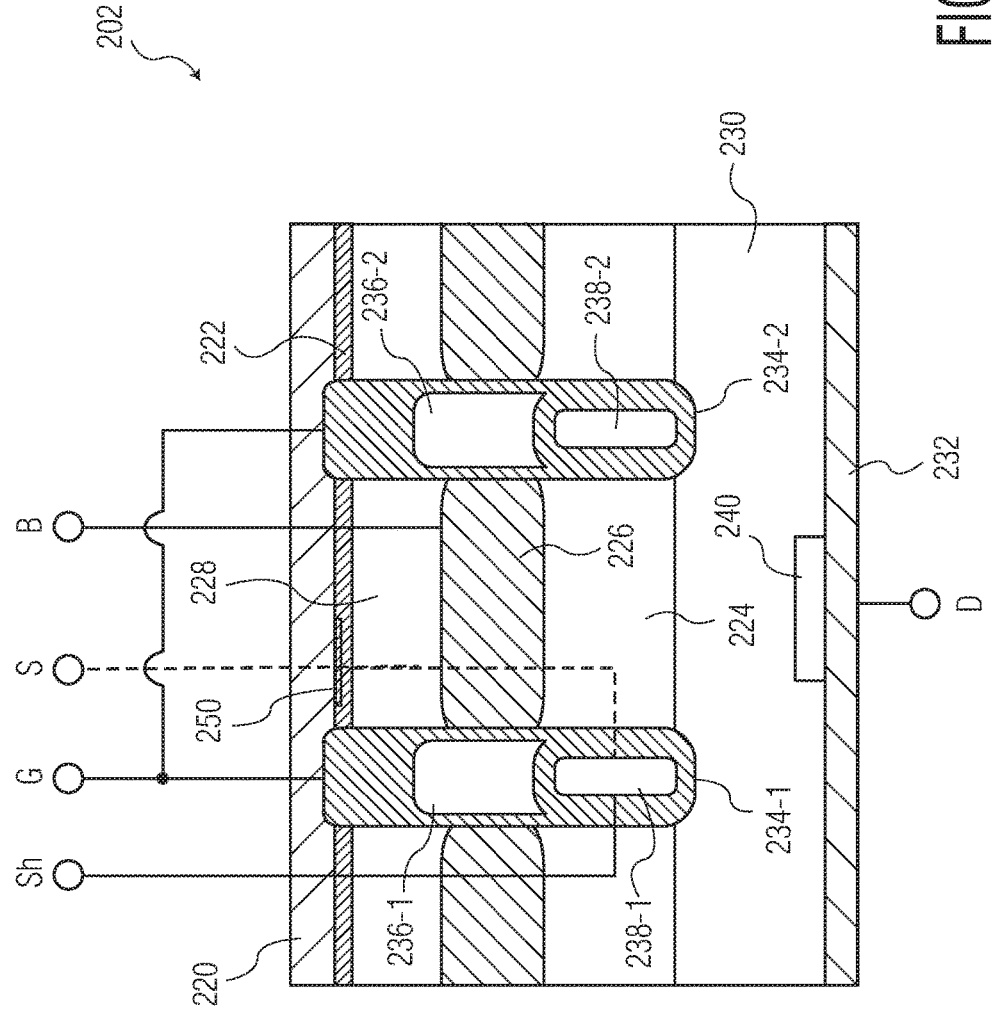
FIG. 2 depicts an embodiment of the bi-directional power transistor of the bi-directional switching device depicted in FIG. 1.

FIG. 2 depicts an embodiment of the bi-directional power transistor 102 of the bi-directional switching device 100 depicted in FIG. 1. In the embodiment depicted in FIG. 2, a bi-directional power transistor 202 includes a passivation layer 220, a doped layer 222, a first drift region 224, a body layer 226, a second drift region 228, a substrate layer 230, and a metal layer 232. The passivation layer may be a non-metal protection layer. The bi-directional power transistor includes the bi-directional power transistor 202 includes a body terminal/electrode B, a drain terminal/electrode D, a gate terminal/electrode G, a shield terminal/electrode, Sh, and a source terminal/electrode S two vertical trenches 234-1, 234-2, which include higher field plates 236-1, 236-2 and lower field plates 238-1, 238-2, respectively. The bi-directional power transistor 202 depicted in FIG. 2 is one possible embodiment of the bi-directional power transistor 102 depicted in FIG. 1. However, the bi-directional power transistor 102 depicted in FIG. 1 is not limited to the embodiment shown in FIG. 2. The bi-directional power transistor 202 depicted in FIG. 2 is similar to or the same as the bi-directional power transistor depicted in FIG. 1 of U.S. patent application Ser. No. 14/870,311, titled "Transistor Body Control Circuit and an Integrated Circuit," filed on Sep. 30, 2015, which is incorporated herein by reference in its entirety.

In the embodiment depicted in FIG. 2, the bi-directional power transistor 202 includes a body terminal/electrode B, a drain terminal/electrode D, a gate terminal/electrode G, a shield terminal/electrode, Sh, and a source terminal/electrode S. The bi-directional power transistor can support high currents and/or voltages from the source terminal S towards the drain terminal D and vice-versa. For example, the bi-directional power transistor may have a current maximum of more than 1 A, 10 A, or 100 A. In addition, the bi-directional power transistor may have a positive drain-source break-down voltage or a negative drain-source break-down voltage. The drain terminal D of the bi-directional power transistor is electrically connected to the metal layer 232. The source terminal S of the bi-directional power transistor is electrically connected to the doped layer 222. The gate terminal G of the bi-directional power transistor is electrically connected to the higher field plates 236-1, 236-2 within the vertical trenches 234-1, 234-2. The shield terminal Sh of the bi-directional power transistor is electrically connected to a lower field plate 238-1 within the vertical trench 234-1. Using the shield electrode Sh, the voltage of the lower field plate 238-1 can be controlled separately from the voltage and/or current of the other electrodes. However, the source terminal S can alternatively be connected to the lower field plate 238-1, as indicated in FIG. 1 with the dashed line, or left floating. The body terminal B of the bi-directional power transistor is connectable to an external power supply and is electrically connected to the body layer 226 of the bi-directional power transistor. An electrical path is present between the passivation layer 220 and the metal layer 232, through the second drift region 228, the body layer 226, and the first drift region 224. The electrical path can be selectively enabled or disabled to allow current to flow in a first direction, e.g., from the passivation layer to the metal layer or in a second direction, opposite to the first direction, by applying suitable signals and power to the terminals B, D, G, Sh and S.

In the bi-directional power transistor 202 depicted in FIG. 2, a drain region 240 is formed in the substrate layer 230 and a source region 250 is formed in the doped layer 222. On the bottom of the substrate layer, also referred to as the backside of the bi-directional power transistor, the metal layer 110 is provided which constitutes the electrode for the drain region, allowing the drain region to be connected to an external voltage or current supply. A suitably patterned and structured layer stack (formed by the passivation layer 220, the doped layer 222, the first drift region 224, the body layer 226, and the second drift region 228) is provided on the top-side of the substrate layer by semiconductor processing, such as successive patterning, doping, deposition, etching, etc. The top surface of the layer stack is covered by the passivation layer of a suitable dielectric material. The passivation layer shields the rest of the bi-directional power transistor from ambient influences, such as oxidations or otherwise.

In the embodiment depicted in FIG. 2, the vertical trenches 234-1, 234-2 are present in the bi-directional power transistor 202. The vertical trenches may be filled with a dielectric material. Each of the vertical trenches extends in the vertical direction from the passivation layer 220 to the substrate layer 230. The bi-directional power transistor is defined in the lateral direction by the vertical trenches. Hereinafter, the vertical sidewalls of the trenches closest to, and facing towards, the body layer 226 are referred to as the "inner sidewalls" and the vertical sidewalls facing away from the body layer are referred to as the "outer sidewalls." The inner sidewalls of the vertical trenches confine the current laterally and thus form the lateral boundaries of the current path.

In the bi-directional power transistor 202 depicted in FIG. 2, each of the vertical trenches 234-1, 234-2 includes the higher field plate 236-1 or 236-2 in a first/higher section/part of the vertical trench. The higher field plate is connected to the gate terminal G of the bi-directional power transistor and is electrically isolated from the body layer 226 by a gate dielectric layer lining the inner sidewall in a first part of the trench. The higher field plate is coupled to the body layer and, when a suitable voltage is applied to the gate terminal, G, a vertical conductive channel is formed in the body layer. Through the vertical channel, a current can flow from the first drift region 224 to the second drift region 228, when the drain region 240 is at a positive voltage with respect to the source region, or vice versa when the source region 250 is at a positive voltage with respect to the drain region.

In some embodiments, the first and second vertical trenches 234-1, 234-2 extend in the vertical direction from the passivation layer 220 to the first drift region 224, and in a lateral direction parallel to the substrate layer. Thereby, the risk of an unexpected breakdown of the bi-directional power transistor 202 can be reduced. Unexpected breakdown can be caused by voltage and/or current events in other power transistors (e.g., adjacent cells) or devices. In addition, by isolating the first drift region in the lateral direction, switching speed can be increased since fewer charge carriers need to be recombined when switching off, i.e., only those in the region between the first and second vertical trenches, rather than in the entire drift region.

In the embodiment depicted in FIG. 2, each lower shield plate 238-1 or 238-2 with a corresponding vertical trench 234-1 or 234-2 is capable of generating a vertical accumulation layer in the first drift region 224, e.g., along the inner sidewall of the trench, at the interface between the first drift region and the corresponding vertical trench when the lower shield plate is biased with respect to the voltage of the drain region 240 in a first polarity. For example, in case the drain region includes an n-doped semiconductor material, the accumulation layer can be generated when the lower shield plate is sufficiently positively biased. In a case where the drain region includes a p-doped semiconductor material, the accumulation layer can be generated when the lower shield plate is sufficiently negatively biased. The accumulation layer may extend in the vertical direction through the whole first drift region, from the bottom limit of the body layer 226 up to the drain region 240. Thus, a conductive path between the body layer and the drain region can be established in a relatively fast manner. However, depending on the specific implementation, the accumulation layer can extend in a vertical direction through a part of the first drift region only, and e.g., be spaced from the body layer or the drain region. The lower shield plate can further locally reduce the electrical field density in parts of the first drift region when the lower shield plate is biased with respect to the drain region in a second polarity. For example, in the case where the drain region is n-doped, the reduction is obtained when the lower shield plate is sufficiently negatively biased. Thus, unexpected breakdown can be reduced because overly high electric fields in the first drift region can be avoided while the speed of switching can be improved since the current path through the drift region can be enabled more rapidly by creating the accumulation layer.

In the bi-directional power transistor 202 depicted in FIG. 2, the first drift region 224 and the second drift region 228 can be of a first conductivity type having a first type of majority charge carriers, while the body layer 226 is of a second conductivity type having a second type of majority charge carriers opposite to the first type. For example, the first and second drift regions can be n-type and the body layer can be p-type or vice versa. The first drift region extends in a lateral direction between the vertical trenches and is defined by the inner sidewalls of the vertical trenches 234-1, 234-2. The first drift region extends in a vertical direction from the bottom surface of the body layer until the top-surface of the substrate layer 230. Suitable lower limits for the thickness may be 2 microns or more, and suitable upper limits may be 10 microns or less. The first drift region can be mono-crystalline, and grown on the substrate through, for example, an epitaxial process. The first drift region can be of the same material, e.g., Si, as the drain region 240 but with a lower doping concentration. A suitable dopant may be P or As with a resistivity of 0.05 Ohm*cm or more, e.g., 0.1 Ohm*cm or more, such as 0.2 ohm*cm or more. A suitable upper limit may be a resistivity of 1 Ohm*cm or less. A particularly effective resistivity may be 0.2 Ohm*cm on average but it will be apparent that other values may be used depending on the desired breakdown voltage of the transistor and that the doping concentration does not need to be uniform over the entire drift region. The second drift region may have essentially the same characteristics as the first drift region. In some embodiments, the thickness of the second drift region is much less than that of the first drift region but the thickness may be more or less the same, depending on the desired breakdown voltage of the bidirectional power transistor. A suitable thickness may be 1 micron or more, for example, 1.5 micron.

In the bi-directional power transistor 202 depicted in FIG. 2, the drain region 240 and the source region 250 may be of the same conductivity type as the drift regions 224, 228 and opposite to the conductivity type of the body layer 226. The concentration of majority charge carriers in the drain region is higher than in the first drift region 224. The concentration of majority charge carriers in the source region is higher than in the second drift region 228. The drain region and the source region can be doped or otherwise be provided with a resistivity which is at least one order of magnitude smaller than the resistivity of the drift regions. In some embodiments, the drain region is of a semiconductor material provided with a dopant of the same type as the first drift region (e.g., an n-type doping or a p-type doping) but a higher concentration, which makes the drain region highly conductive compared to the first drift region. The drain region can be any suitable type of substrate such as a mono-crystalline Si substrate and doped with a suitable dopant, such as in the case of an N-doped current terminal Arsenic (As), to obtain a desirable resistivity. The source region can be implemented in any manner suitable for the specific implementation, and can be of similar constitution as the drain region, but in terms of conductivity and doping concentration different, for example, with a doping concentration which is an order of magnitude higher. In the embodiment depicted in FIG. 2, the source region is formed as the area of the top layer of the layer stack between, in the lateral direction, the inner sidewalls of the vertical trenches 234-1, 234-2 and in the vertical direction between the top of the second drift region and the passivation layer 220. However, depending on the specific implementation, the source region can be implemented above the passivation layer, for example, by local formation or deposition of a suitable material on the passivation layer, in the area in the lateral direction between the inner sidewalls of the vertical trenches.

In the bi-directional power transistor 202 depicted in FIG. 2, the body layer 226 is defined in the lateral direction by the inner sidewalls of the vertical trenches 234-1, 234-2 and in the vertical direction by the bottom of the second drift region 228, and the top of the first drift region 224. The body layer extends laterally between the vertical trenches and vertically between the drain region 240 and the source region 250. The first drift region thus extends, in the vertical direction, between the body layer and the drain region, while the second drift region extends, in the vertical direction, between the body layer and the source region. The body layer can be formed by doping a semiconductor material, e.g., Si, with a suitable dopant (e.g., p-type if the drain and source regions 240, 250 are of an n-type). A suitable dopant may be Boron, such as B11. A suitable concentration may be 2 orders of magnitude smaller than that of the drain region.

In an example operation, the bi-directional power transistor 202 operates intermittently in a first direction and in a second direction, i.e., in a bi-directional manner. The bi-directional power transistor can be symmetric with positive and negative break-down voltages that have the same absolute value, or can be asymmetric, with different values, depending on the specific implementation. For example, depending on the specific implementation of the thickness of the first drift region 224 and/or the second drift region 228, a breakdown voltage can be obtained for a specific implementation.

The bi-directional nature of the bi-directional power transistor 202 will now be described in operation, using the example of an n-type power transistor. In a first direction and with respect to switching the bi-directional power transistor on, a positive voltage (relative to the source) can be applied to the drain terminal, D. The body terminal, B, can be connected to the source terminal, S, so as to electrically couple the body layer 226 to the source region 250 of the bi-directional power transistor. A voltage lower than the voltage of the drain terminal, D (e.g., 0 V or the source voltage if the drain terminal is at a positive voltage) can then be applied the lower shield plate 238-1 or 238-2 to shield the gate terminal, G, from the voltage applied to the drain terminal, D. By applying a positive gate-source bias voltage (i.e., $V_{gs} > 0$ V) to the gate terminal, G, by an external gate driver circuit (not shown), a depletion field effect can be caused through the gate dielectric at an interface between the body layer and the first and second trenches 234-1, 234-2 in which the high shield plate 236-1 or 236-2 is provided. When the gate bias voltage exceeds a threshold voltage, $V_{th}$, an inversion conducting n-layer is formed along the interface of the corresponding trench and the body layer, which conducts the majority of carriers injected from the source region to be collected by the drain region 240.

In an off-state, a positive voltage can be applied to the drain region 240. The body layer 226 can still be electrically tied to the source region 250. The gate bias voltage can be set to the lowest potential, e.g., $V_{gs} = 0$ V. A first depletion layer can be formed around a bottom p-n junction formed by the interface of the body layer and the first drift region 224. By increasing the drain-source bias voltage, $V_{ds}$, a first space charge region of the depletion layer can increase to the low-doped bottom part of the first drift region. The electrical field in the source region thereby increases and when a breakdown voltage is reached, an avalanche phenomena by carrier impact ionization can be observed causing breakdown of the reverse biased junction.

In the second direction and in relation to an on-state, the body terminal, B, can be set such that the drain potential is coupled to the body layer 226. A positive voltage can be applied to the source region. In the second direction, a positive bias voltage, e.g., the source voltage, can shield the higher shield plate 236-1 or 236-2 from the drain region, reducing the electrical field density in at least a part of the first drift region, and accordingly causing the breakdown voltage to increase.

A positive gate bias voltage, $V_{gd} > 0$ V, can be applied to the gate terminal, G, by an external gate driver circuit (not shown), thereby causing a depletion field effect through the gate dielectric into the body layer 226 along the inner sidewalls of the trenches 234-1, 234-2. When the gate bias voltage exceeds the threshold voltage, $V_{th}$, an inversion conducting layer can be formed along the interface of the trench dielectric and the body layer, which can conduct the majority of the carriers injected from the substrate layer 230 and collected by the source region 250.

In an off state, a positive voltage can be applied to the source region 250. The body layer 226 can still be electrically tied to the potential of the drain region 240. The gate-drain bias voltage, $V_{gd}$, can be set to the lowest potential, namely, $V_{gd} = 0$V. A second depletion layer can be formed around a top p-n junction formed by the interface of the body layer and the second drift region 228. By increasing the source-drain bias voltage, Vsd, a second space charge region of the depletion layer can increase to the low-doped top part of the second drift region. The electrical field in the second drift region can thereby increase and when a breakdown voltage is reached, an avalanche phenomena by carrier impact ionization can be observed causing breakdown of the reverse biased junction, thereby implementing the blocking voltage.

Turning back to FIG. 1, the transistor body control device 104 of the bi-directional switching device 100 includes a resistor 106 and a transistor body switch circuit 108. In some embodiments, the resistor and the transistor body switch circuit are located in different IC dice/dies or different IC packages. In some embodiments, the transistor body control device is a packaged IC device with pins/terminals connectable to the bi-directional power transistor. In some embodiments, the transistor body switch circuit is a packaged IC device with pins/terminals connectable to the resistor and to the bi-directional power transistor. In the embodiment depicted in FIG. 1, the resistor is integrated on the control die 150. However, in other embodiments, the resistor is integrated on the power die 140. Both the power die and the control die are assembled in the same IC package. The resistor is connected between the body terminal, B, of the bi-directional power transistor 102 and the transistor body switch circuit. In some embodiments, the resistance value of the resistor is the same or more than the resistance value of the inherent body resistance of the bi-directional power transistor. The inherent body resistance of the bi-directional power transistor may be the resistance of the body layer 226 of the bi-directional power transistor 202 depicted in FIG. 2. The resistor can improve the reliability of the bi-directional switching device 100 during a fast turn-off. For example, the body layer 226 of the bi-directional power transistor 202 depicted in FIG. 2 may be a buried p-layer located between two low doped n-epi layers. The doping level of the body layer is limited to a certain threshold (e.g., 2e17 cm-3) because of, for example, voltage threshold Vth adjustment of the bi-directional power transistor 202. The sheet resistivity of the p-body layer of the bi-directional power transistor may be around 200 ohm/square-2 kohm/square. Parasitic bipolar injection between the source terminal, S, and the drain terminal D of the bi-directional power transistor during fast transient turn-off can lower the barrier between the body/source p-n junction and cause a negative ohmic snapback effect. Consequently, current focalization can occur in a narrow device area and premature device destruction events may happen. The resistor can make the current distribution along the active area of the bi-directional power transistor and between the source and drain terminals, S and D, of the bi-directional power transistor more uniform when a direct current injection between the source and drain terminals, S and D, of the bi-directional power transistor is induced during fast turn-off or fast dVds/dt or dVgs/dt (e.g., during relay switching or load dump). Consequently, current focalization, which causes premature destructive events, can be avoided in small circuit area. In addition, destructive snapbacks caused by fast transients during turn-off can be prevented.

The transistor body switch circuit 108 of the transistor body control device 104 includes first and second switch devices 110-1, 110-2 and first and second alternating current (AC) capacitive voltage dividers 112-2, 112-2. The first and second switch devices may be field effect transistors or other suitable types of switch circuits. The first and second switch devices are connectable between the body terminal, B, of the bidirectional power transistor 102 and a respective one of the drain terminal, D, and the current terminal, S, of the bidirectional power transistor. The current flowing through the first and second switch devices can be controlled through a respective control terminal 114-1, 114-2, e.g., a gate terminal, of the first and second switch devices. The control terminal 114-1 of the first switch device 110-1 is connected to the first AC capacitive voltage divider 112-1 and the control terminal 114-2 of the second switch device 110-2 is connected to the second AC capacitive voltage divider 112-2. The first and second AC capacitive voltage dividers are connectable to the drain and source terminals, D and S, of the bidirectional power transistor. The first and second AC capacitive voltage dividers, when in operation, control the first and second switch devices to switch the voltage of the body terminal, B, of the bidirectional power transistor as a function of the voltage between the drain terminal, D, and the source terminal, S. The first and second AC capacitive voltage dividers reduce the risk that the first and second switch devices will be damaged by high voltage applied to the drain and source terminals, D and S, of the bidirectional power transistor because the voltage applied to the control terminal of the first and second switch devices is only a fraction of the voltage between the drain and source terminals, D and S, of the bidirectional power transistor. In some embodiments, each AC capacitive voltage divider includes one or more capacitors. In one embodiment, the control terminal of a respective switch device may be connected to a divided voltage node between two capacitors, to be set to the voltage of that node and hence control the state of the switch device to be conductive (closed) or non-conductive (open).

The breakdown voltage of the bidirectional power transistor 202 is increased if the voltage of the body layer 226 is actively controlled and not left floating. In an example operation of the transistor body switch circuit 108, the first and second switch devices 110-1, 110-2 are controlled by the first and second AC capacitive voltage dividers 112-1, 112-2 such that when one of the switch devices is non-conductive (open), the other one of the switch devices is conductive (closed) and accordingly the body layer of the bidirectional power transistor is either set to the voltage of the drain terminal, D, or to the voltage of the source terminal, S, of the bidirectional power transistor. For example, the body layer of the bidirectional power transistor can be set to the lowest of the voltage of the drain terminal, D, and the source terminal, S, of the bidirectional power transistor.

Figure 3:
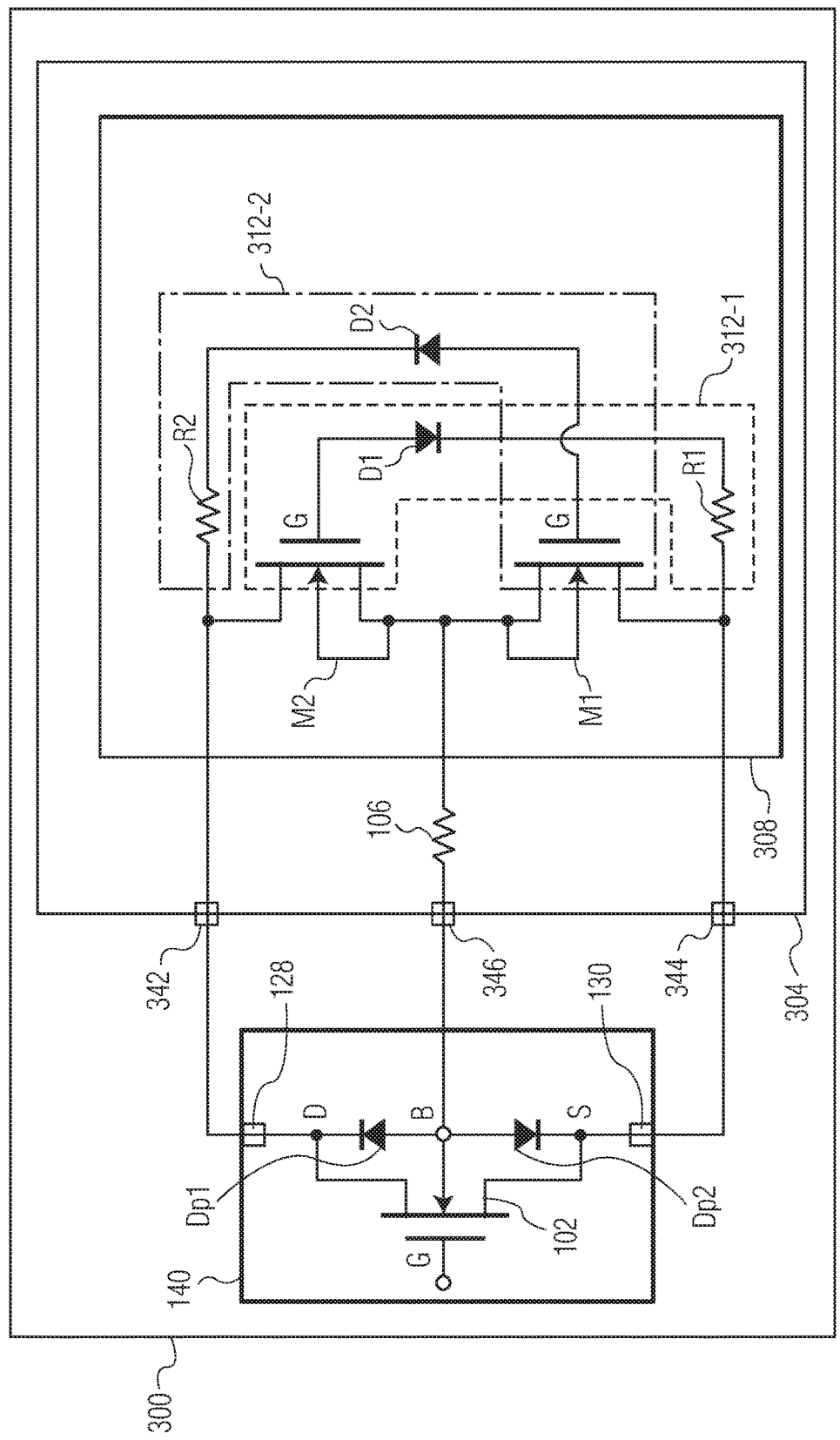
FIG. 3 depicts an embodiment of the bi-directional switching device depicted in FIG. 1.

FIG. 3 depicts an embodiment of the bi-directional switching device 100 depicted in FIG. 1. In the embodiment depicted in FIG. 3, a bi-directional switching device 300 includes the bi-directional power transistor 102 and a transistor body control device 304, which includes the resistor 106 and a transistor body switch circuit 308. The drain terminal, D, of the bi-directional power transistor is connected to a drain contact/pin 342 of the transistor body control device. The source terminal, S, of the bi-directional power transistor is connected to a source contact/pin 344 of the transistor body control device. The body terminal, B, of the bi-directional power transistor is connected to a body contact/pin 346 of the transistor body control device 104. The transistor body control device may be located in an IC die/package that is separate from the power MOSFET die 140 at which the bi-directional power transistor is located. The bi-directional switching device 300 depicted in FIG. 3 is one possible embodiment of the bi-directional switching device 100 depicted in FIG. 1. However, the bi-directional switching device 100 depicted in FIG. 1 is not limited to the embodiment shown in FIG. 3.

In the embodiment depicted in FIG. 3, the transistor body switch circuit 308 includes a first field effect transistor (FET) M1, a second FET M2, a first diode D1, a second diode D2, a first resistor R1, and a second resistor R2. The FETs M1, M2 are connected between the resistor 106 and a respective one of the drain and source terminals, D and S, of the bidirectional power transistor 102. The current flowing through the FETs M1, M2 is controlled through a respective gate terminal of the FETs M1, M2. The gate terminal, G, of the FET M1 is connected to the diode, D2, which is in turn connected to the resistor R2 while the gate terminal, G, of the FET M2 is connected to the diode D1, which is in turn connected to the resistor R1. The first and second resistors R1, R2 are connected to respective contacts/pins 344, 342 of the transistor body switch circuit, which are connected to the drain and source terminals, D and S, of the bidirectional power transistor, respectively.

The inherent capacitance of the FETs M1, M2 can be used as a capacitive element for AC capacitive voltage dividers 312-1, 312-2. In the embodiment depicted in FIG. 3, the FETs M1, M2 are n-type MOSFETs operated in depletion mode, and the inherent capacitance between the gate and body of the FET M1 is used as a capacitive element of the first AC capacitive voltage divider 312-2 and the inherent capacitance between the gate and body of the FET M2 is used as a capacitive element of the second AC capacitive voltage divider 312-1, respectively. Specifically, as shown in FIG. 3, the first AC capacitive voltage divider 312-1 includes the resistor R1, the diode D1, and the gate capacitance of the FET M2 and the second AC capacitive voltage divider 312-2 includes the resistor R2, the diode D2, and the gate capacitance of the FET M1. Consequently, the transistor body switch circuit 308 depicted in FIG. 3 does not need an additional capacitive element, allowing the size of the transistor body switch circuit to be reduced since capacitors occupy a relatively large amount of circuit area.

Each of the diodes, D1 and D2, is connected with its cathode to the respective resistor R1 or R2 and with an anode to the gate terminal G of the corresponding FET M1 or M2. Thus, when the diode D1 is in reverse mode, i.e. the voltage of the source contact 344 is high, the gate terminal of the second FET M2 receives a divided voltage equal to the ratio of the capacitance of the diode, D1, and the gate capacitance of the second FET M2. When the diode, D1, is in forward mode (i.e., the voltage of the source contact is low) the capacitance of the diode, D1, is almost negligible and the gate terminal, G, of the second FET M2 receives a voltage that is proportional to the resistance of the resistor, R1. The first FET M1 is operated in a similar manner relative to the drain contact 342, depending on the mode of the diode, D2, (forward or reverse). Thus, when the diode, D2, connected to the first FET M1 is in reverse mode, i.e. the voltage of the source contact is high, the gate terminal of the first FET M1 receives a divided voltage equal to the ratio of the diode capacitance of the diode, D2, and the gate capacitance of the first FET M1. When the diode, D2, is in forward mode (i.e., the voltage of the source contact is low), the capacitance of the diode, D2, is almost negligible and the gate terminal, G, of the first FET M1 receives a voltage that is proportional to the resistance of the resistor, R2.

In the embodiment depicted in FIG. 3, the AC capacitive voltage dividers, 312-1, 312-2, when in operation, control the FETs M1, M2 to switch the voltage of the body terminal, B, of the bidirectional power transistor 102 to the drain terminal, D, of the bidirectional power transistor or to the source terminal, S, of the bidirectional power transistor as a function of the voltage between the drain terminal, D, of the bidirectional power transistor and the source terminal, S, of the bidirectional power transistor. The AC capacitive voltage dividers reduce the risk that the FETs M1, M2 will be damaged by high voltage applied to the drain and source terminals, D and S, of the bidirectional power transistor because only a fraction of the voltage between the drain and source terminals D, S of the bidirectional power transistor is applied to the gate terminal, G, of the FETs M1, M2. The FETs, M1, M2 are controlled by the AC capacitive voltage dividers such that when one of the FETs, M1, M2 is open, the other one of the FETs, M1, M2 is closed and accordingly the body terminal, B, of the bidirectional power transistor is set to the lowest of the voltage of the drain and source terminals, D and S, of the bidirectional power transistor. The FET M1 may be switched to be closed if the voltage at the drain contact 342 is positive relative to the voltage of the source contact 344 and to be open if the voltage at the drain contact 342 is negative relative to the voltage of the source contact 344. Similarly, the FET M2 may be switched to be open if the voltage at the drain contact 342 is positive relative to the voltage of the source contact 344 and closed if the voltage at the drain contact 342 is negative relative to the voltage of the source contact 344.

Figure 4:
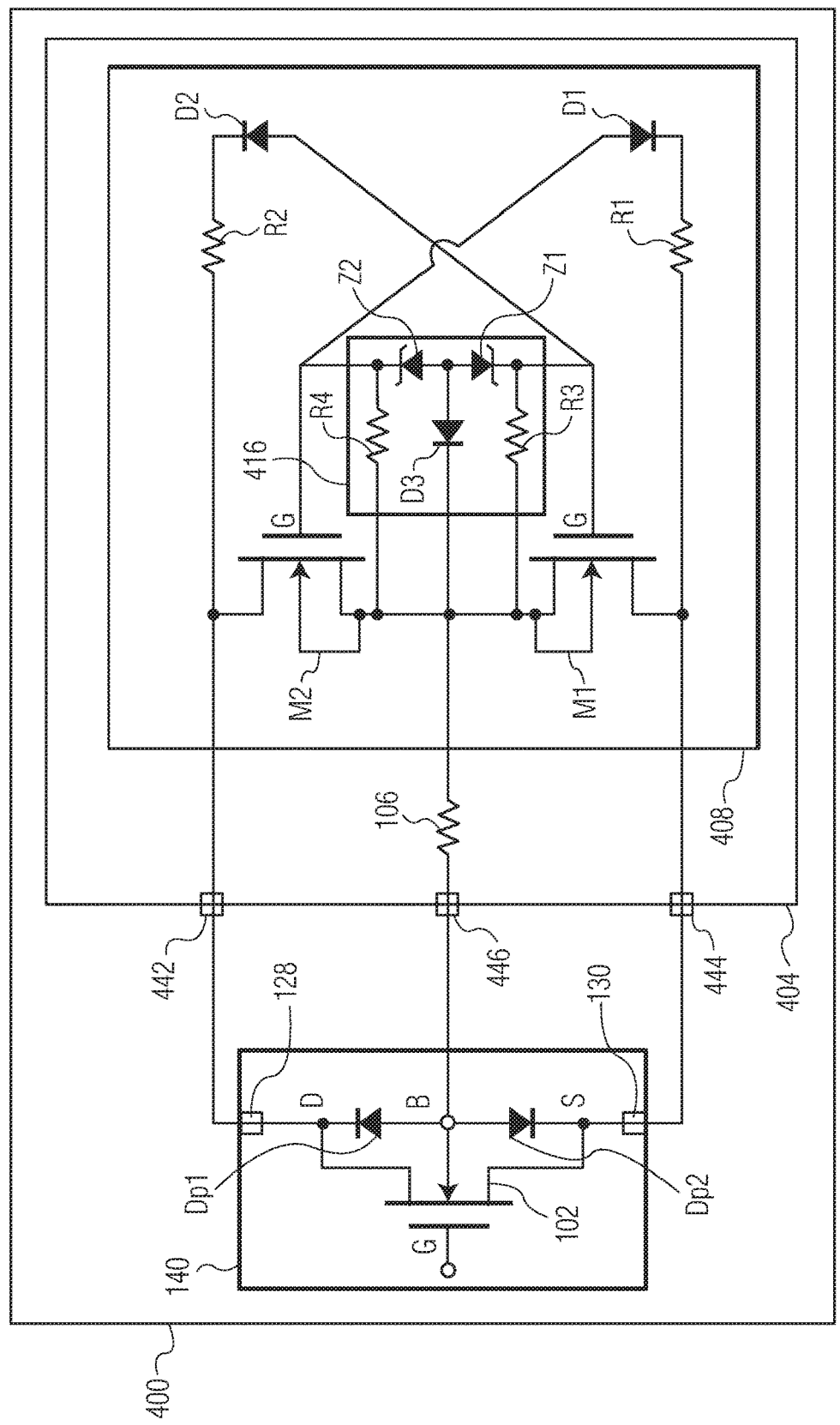
FIG. 4 depicts another embodiment of the bi-directional switching device depicted in FIG. 1.

FIG. 4 depicts another embodiment of the bi-directional switching device 100 depicted in FIG. 1. In the embodiment depicted in FIG. 4, a bi-directional switching device 400 includes the bi-directional power transistor 102 and a transistor body control device 404, which includes the resistor 106 and a transistor body switch circuit 408. The drain terminal, D, of the bi-directional power transistor is connected to a drain contact 442 of the transistor body control device. The source terminal, S, of the bi-directional power transistor is connected to a source contact 444 of the transistor body control device. The body terminal, B, of the bi-directional power transistor is connected to a body contact 446 of the transistor body control device 104. The bi-directional switching device 400 depicted in FIG. 4 is one possible embodiment of the bi-directional switching device 100 depicted in FIG. 1. However, the bi-directional switching device 100 depicted in FIG. 1 is not limited to the embodiment shown in FIG. 4.

In the embodiment depicted in FIG. 4, the transistor body switch circuit 408 includes the FETs M1, M2, the diodes D1, D2, the resistors R1, R2 and a clamp circuit 416 configured to clamp a voltage difference between each of the gate terminals, G, of the FETs M1, M2 relative to the body terminal, B, of the bidirectional power transistor to be below the breakdown voltage of the gate terminal of the FET M1 or M2. The clamp circuitry includes a diode, D3, two pull-down resistors R3 and R4, and two Zener diodes Z1 and Z2 connected to each other by their anodes, while connected by their cathodes to a respective one of the FET M1, M2. The Zener diodes Z1, Z2 clamp the gate terminals, D, of the FETs M1, M2 relative to their anodes, while the anodes of the Zener diodes Z1, Z2, in turn, are clamped relative to the body contact 246 by the diode, D3, connected by its cathode to the body contact and by the anode of the diode, D3, to the anodes of the Zener diodes. The breakdown voltage of the Zener diode plus the forward voltage of the diode, D3, are chosen to be below the breakdown voltage of the FETs M1, M2 (e.g., the gate oxide breakdown voltage). For example, the clamping voltage is chosen to be 5 V when the gate oxide breakdown voltage is 8 V. The gate terminals, G, of the FETs M1, M2 are connected to the body contact through the pull-down resistors, R3 and R4, which prevent the voltage of the gate terminals, G, of the FETs M1, M2 from floating and thus ensure that the FETs M1, M2 are always in a defined state.

Figure 5:
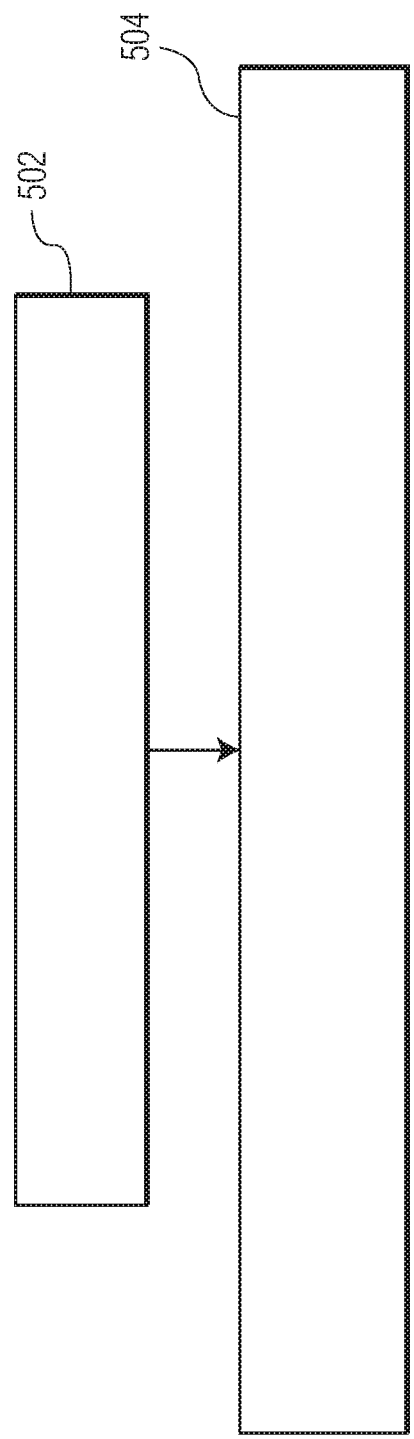
FIG. 5 is a process flow diagram of a method for controlling a bi-directional power transistor in accordance with an embodiment of the invention.

FIG. 5 is a process flow diagram of a method for controlling a bi-directional power transistor in accordance with an embodiment of the invention. At block 502, a voltage is applied to a body terminal of the bi-directional power transistor through a resistor. At block 504, the voltage of the body terminal of the bi-directional power transistor is switched as a function of a voltage between a drain terminal of the bi-directional power transistor and a source terminal of the bi-directional power transistor. The bi-directional power transistor may be the same or similar to the bi-directional power transistor 102 depicted in FIG. 1 and/or the bi-directional power transistor 202 depicted in FIG. 2. The resistor may be the same or similar to the resistor 106 depicted in FIG. 1.

The present disclosure extends to the following series of lettered clauses: (A) An integrated circuit (IC) device for controlling a bi-directional power transistor, the IC device comprising: a resistor connectable to a body terminal of the bi-directional power transistor; and a transistor body switch circuit connectable to the resistor, to a drain terminal of the bi-directional power transistor, and to a source terminal of the bi-directional power transistor, wherein the transistor body switch circuit comprises a plurality of switch devices and a plurality of alternating current (AC) capacitive voltage dividers connected to control terminals of the switch devices, and wherein the AC capacitive voltage dividers are configured to control the switch devices to switch a voltage of the body terminal of the bi-directional power transistor as a function of a voltage between the drain terminal of the bi-directional power transistor and the source terminal of the bi-directional power transistor; (B) the IC device of clause (A), wherein a resistance value of the resistor is the same as or more than a resistance value of an inherent body resistance of the bi-directional power transistor; (C) the IC device of clause (B), wherein the bi-directional power transistor comprises a passivation layer, a doped layer, a first drift region, a body layer, a second drift region, a substrate layer, a metal layer, and two vertical trenches extending from the passivation layer to the substrate layer, and wherein each of the vertical trenches comprises a plurality of field plates; (D) the IC device of clause (C), wherein at least one of the AC capacitive voltage dividers comprises a diode and a second resistor, wherein a cathode of the diode is connected to the second resistor, and wherein an anode of the diode is connected to the control terminal of a corresponding switch device; (E) the IC device of clause (C), wherein the switch devices comprise a first field effect transistor (FET) and a second FET, wherein the AC capacitive voltage dividers comprise a first AC capacitive voltage divider and a second AC capacitive voltage divider, wherein the first AC capacitive voltage divider comprises a first diode, a second resistor and a gate capacitance of the second FET, wherein the second AC capacitive voltage divider comprises a second diode, a third resistor, and a gate capacitance of the second FET, wherein a cathode of the first diode is connected to the second resistor, wherein an anode of the first diode is connected to a gate terminal of the second FET, wherein a cathode of the second diode is connected to the third resistor, and wherein an anode of the second diode is connected to a gate terminal of the first FET; (F) the IC device of clause (E), wherein the transistor body switch circuit further comprises a clamp circuit connected to the resistor, to the first FET, and to the second FET, and wherein the clamp circuit is configured to clamp a voltage difference between each of the gate terminals of the first and second FETs relative to the body terminal of the bi-directional power transistor to be below the breakdown voltage of the gate terminals of the first and second FETs.

In addition, the present disclosure extends to the following series of lettered clauses: (A) A method for controlling a bi-directional power transistor, the method comprising: applying a voltage to a body terminal of the bi-directional power transistor through a resistor; and switching the voltage of the body terminal of the bi-directional power transistor as a function of a voltage between a drain terminal of the bi-directional power transistor and a source terminal of the bi-directional power transistor.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, the semiconductor substrate described herein can be any semiconductor material or combinations of materials, such as gallium arsenide, silicon germanium, silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein. For example, the bi-directional power transistor 202 shown in FIG. 2 may be used in an up-side down or a rotated position relative to that shown in the drawing without affecting its operation.

What is claimed is:

1. A transistor control device for controlling a bi-directional power transistor, the transistor control device comprising:
a resistor connectable to a body terminal of the bi-directional power transistor; and
a transistor body switch circuit connectable to the resistor, to a drain terminal of the bi-directional power transistor, and to a source terminal of the bi-directional power transistor, wherein the transistor body switch circuit comprises a plurality of switch devices and a plurality of alternating current (AC) capacitive voltage dividers connected to control terminals of the switch devices, and wherein the AC capacitive voltage dividers are configured to control the switch devices to switch a voltage of the body terminal of the bi-directional power transistor as a function of a voltage between the drain terminal of the bi-directional power transistor and the source terminal of the bi-directional power transistor.

2. The transistor control device of claim 1, wherein a resistance value of the resistor is the same as or more than a resistance value of an inherent body resistance of the bi-directional power transistor.

3. The transistor control device of claim 1, wherein the bi-directional power transistor comprises a bi-directional trench transistor having two vertical trenches.

4. The transistor control device of claim 1, wherein at least one of the AC capacitive voltage dividers comprise a diode and a second resistor, wherein a cathode of the diode is connected to the second resistor, and wherein an anode of the diode is connected to the control terminal of a corresponding switch device.

5. The transistor control device of claim 1, wherein the switch devices comprise a first field effect transistor (FET) and a second FET, wherein the AC capacitive voltage dividers comprise a first AC capacitive voltage divider and a second AC capacitive voltage divider, wherein the first AC capacitive voltage divider comprises a first diode, a second resistor and a gate capacitance of the second FET, and wherein the second AC capacitive voltage divider comprises a second diode, a third resistor, and a gate capacitance of the first FET.

6. The transistor control device of claim 5, wherein a cathode of the first diode is connected to the second resistor, wherein an anode of the first diode is connected to a gate terminal of the second FET, wherein a cathode of the second diode is connected to the third resistor, and wherein an anode of the second diode is connected to a gate terminal of the first FET.

7. The transistor control device of claim 5, wherein the second resistor is connectable to the source terminal of the bi-directional power transistor, and wherein the third resistor is connectable to the drain terminal of the bi-directional power transistor.

8. The transistor control device of claim 1, wherein the resistor is connected to a node between the first and second FETs.

9. The transistor control device of claim 5, wherein the transistor body switch circuit further comprises a clamp circuit connected to the resistor, to the first FET, and to the second FET, and wherein the clamp circuit is configured to clamp a voltage difference between each of the gate terminals of the first and second FETs relative to the body terminal of the bi-directional power transistor to be below the breakdown voltage of the gate terminals of the first and second FETs.

10. The transistor control device of claim 9, wherein the clamp circuit comprises a third diode, a plurality of pull-down resistors, and a plurality of Zener diodes.

* * * * *